United States Patent [19]

Maslowski et al.

[11] Patent Number: 5,622,547
[45] Date of Patent: Apr. 22, 1997

[54] VEHICLE SYSTEM FOR THICK FILM INKS

[75] Inventors: Anthony R. Maslowski, Harleysville, Pa.; David J. Nabatian, Wayne, N.J.; Orville W. Brown, Landsdale, Pa.

[73] Assignee: National Starch and Chemical Investment Holding Corporation, Wilmington, Del.

[21] Appl. No.: 515,087

[22] Filed: Aug. 14, 1995

[51] Int. Cl.⁶ .............................. C09D 11/06; C09D 11/08
[52] U.S. Cl. .................. 106/20 B; 106/27 A; 106/27 B; 106/28 R
[58] Field of Search .................................. 106/1.18, 1.21, 106/20 B, 27 A, 27 B, 28 R

[56] References Cited

U.S. PATENT DOCUMENTS

| | | | |
|---|---|---|---|
| 3,947,277 | 3/1976 | Carnahan et al. | 106/26 A |
| 3,947,278 | 3/1976 | Youtsey | 106/26 A |
| 3,985,663 | 10/1976 | Lu et al. | 106/20 B |
| 3,992,212 | 11/1976 | Youtsey et al. | 106/26 A |
| 4,061,584 | 12/1977 | Girard et al. | 106/20 B |
| 4,152,282 | 5/1979 | Baudry et al. | 106/20 B |
| 4,479,890 | 10/1984 | Prabhu et al. | 106/20 B |
| 4,496,475 | 1/1985 | Abrams | 252/514 |
| 4,548,741 | 10/1985 | Hormadaly | 252/518 |
| 4,576,735 | 3/1986 | Kuroki et al. | 252/512 |
| 4,654,166 | 3/1987 | Hormadaly | 252/518 |
| 4,793,946 | 12/1988 | Hsu | 252/514 |
| 4,810,420 | 3/1989 | Prabhu et al. | 106/20 B |
| 4,830,988 | 5/1989 | Hang et al. | 501/21 |
| 4,859,364 | 8/1989 | Yamamoto et al. | 252/512 |
| 4,880,567 | 11/1989 | Prabhu et al. | 252/512 |
| 4,906,406 | 3/1990 | Hormadaly | 252/519 |
| 4,937,016 | 6/1990 | Suehiro et al. | 252/512 |
| 4,961,999 | 10/1990 | Hormadaly | 428/427 |
| 4,964,948 | 10/1990 | Reed | 106/20 B |
| 5,009,708 | 4/1991 | Grunwald et al. | 106/20 B |
| 5,062,891 | 11/1991 | Gruber et al. | 106/20 B |
| 5,089,172 | 2/1992 | Allison et al. | 252/512 |
| 5,407,473 | 4/1995 | Miura et al. | 106/20 B |

FOREIGN PATENT DOCUMENTS

278464A3  5/1990  Germany.

OTHER PUBLICATIONS

Arizona Chemical, Prelim Data Sheets No. 7004 (1992) 4 pages and No. 7005 1 page (no data) for Nirez ® 9014 and 9017, respectively.
Arizona Tofa Esters Applications, 1 sheet, (no date).
ISP Technologies Inc. Material Saftey Data Sheet for PVP K–15 (1994) 2 pages.

*Primary Examiner*—Helene Klemanski
*Attorney, Agent, or Firm*—Jane E. Gennaro

[57] ABSTRACT

A vehicle system for thick film electrically functional inks comprises esters of tall oil fatty acids substituted for 1–90% of the typical organic solvent.

5 Claims, No Drawings

VEHICLE SYSTEM FOR THICK FILM INKS

FIELD OF THE INVENTION

This invention pertains to vehicle systems in thick film inks used in the screen printing of electronic circuitry.

BACKGROUND OF THE INVENTION

Electronic circuits are fabricated by various deposition processes, one of which is by the screen printing of conductive, resistive, and dielectric inks in specific patterns on a ceramic substrate. The conductive, resistive, and dielectric inks, known as thick film inks, are prepared from finely divided powders (about 0.1–20 microns) of conductive, resistive, or dielectric materials dispersed in an organic vehicle.

The circuits may be a single layer of conductive and resistive material, or may be multilayers of conductors separated by layers of dielectric, in which the conductors are connected through vias in the dielectric layers. Conductor and resistor patterns form the top layer. As the microelectronics industry increasingly demands smaller geometries and faster assembly times, it becomes advantageous to be able to screen print finer features onto a circuit board and to reduce the total number of layers that must be printed to form the circuits.

The organic vehicle for thick film inks should have good wetting properties to thoroughly disperse the powder and allow it to pass through the screen more readily. The vehicle should also have good thixotropic properties, meaning the ink exhibits a drop in viscosity during the shear of printing and a full recovery after removal of the shear. This prevents the ink from spreading once it is deposited on the circuit board.

In the case of dielectric inks, the number of layers can be reduced if the solids content of the ink is increased. When the solids content is increased, however, the vehicles in current use do not sufficiently wet out the powders, and the ink becomes tacky and does not transfer well from the screen during the printing operation. If sufficient surfactants are added to counteract the tackiness and poor transfer properties, the ink will then exhibit considerable shear thinning during the screen printing process without adequate recovery immediately after shear is removed. This results in the smudging or closing of the small vias in the dielectric layers of the circuits.

In the case of conductive inks where heavier (than dielectric) metallic powders are used, the vehicle must be able to fully disperse the powder and keep it from settling. If the powders are not fully dispersed, the printed lines will not be well defined or have a smooth surface. Good line definition allows for the printing of denser circuits, and surface smoothness promotes superior wire bonding and soldering of the conductors. The requirement for smooth lines is usually met by lowering the viscosity, which results in loss of definition. Achieving both requirements is difficult with vehicles now in use.

To these difficulties can be added the problem of solvent loss during long screen printing runs, which makes the ink tacky on the screen and adversely affects the quality of the circuits.

The objects of this invention are to provide thick film dielectric inks that hold a sufficiently high solids content to reduce the number of printing operations while maintaining lines with smooth surfaces and vias with fine definition, to provide thick film conductive and resistive inks that can continuously print fine lines with smooth surfaces, and to provide thick film inks of all types that have reduced solvent loss and a longer screen life.

SUMMARY OF THE INVENTION

Conventionally, the organic vehicle for thick film inks is made of cellulosic, acrylic, or phenolic resins, which are dissolved in high boiling solvents, such as, terpene alcohols, oils, or ether alcohols. Additives, such as, thixotropes or surface active agents, which usually are amines, waxes, fatty acids, and like materials, can be incorporated into the vehicles to improve dispersion of the powder.

This invention relates to thick film inks consisting of finely divided conductive, resistive, or insulating powders dispersed in an organic vehicle in which one or more esters of fatty acids, particularly tall oil fatty acids, is substituted for a portion of the usual organic solvent.

Specifically, 100 parts by weight of the thick film ink will comprise 40 to 95 parts of finely divided conductive, resistive, or dielectric powder in 60 to 5 parts of organic vehicle; the organic vehicle, exclusive of the electrically functional powder, will comprise by weight 1–40% resin, 99–60% solvent, and optionally 0.1–20% of additives; and the solvent will comprise 1–90% of esters of fatty acids, where the alcohol of esterification is preferably a $C_1$–$C_6$ alkyl, (methyl, ethyl, butyl, 2-ethyl hexyl, and the like).

When esters of fatty acids are substituted for 1–90% of the ordinary solvents of the vehicle in a dielectric ink, the ink will be capable of being loaded at a higher level of powder, and will exhibit an improvement in rheological characteristics for screen printing. When substituted into a conductive or resistive ink, the presence of the ester will improve the thixotropic and printing properties of the ink, giving smoother surfaces, finer lines, and better definition. In both types of inks, the presence of the ester serves to reduce solvent loss during the printing operation.

DETAILED DESCRIPTION OF THE INVENTION

The thick film inks of this invention are dispersions of metallic, insulating, or semiconducting powders in an organic vehicle in which from 1–90% of the conventionally used solvents have been replaced with one or more esters of fatty acids, particularly tall oil fatty acids.

Tall oil is a mixture of rosin acids, fatty acids, and other substances obtained by acid treatment of the alkaline liquors from the pulping of pine wood. The spent liquor from the pulping process is concentrated until the sodium salts of the various acids separate out and are skimmed off. These are acidified by sulfuric acid. The fatty acid portion is then esterified with various alcohols to give the ester of the tall oil fatty acid. For use in these vehicle systems, the esters may be any ester that provides a Brookfield viscosity below 200 mPa.s.

The finely divided electrically functional powders will be conductive metal powders of gold, silver, platinum, palladium, copper, and like metals; insulating dielectric powders of borosilicate glasses, often mixed with other crystalline powders, such as alumina; and resistive (semi-conducting) powders of ruthenium oxide, lead/bismuth-ruthenates, and other resistive elements as are known in the art.

The organic vehicle typically comprises cellulosic, acrylic, or phenolic resins, dissolved in high boiling solvents, such as, terpene alcohols, oils, or ether alcohols. The most common resin used is ethyl cellulose, which can be commercially obtained in a range of molecular weights to provide a range of viscosities. Exemplary resins that are commercially available include the N, K, and T series of ethyl celluloses available from Aqualon, A Division of Hercules, Inc., Wilmington, Del. Other commonly used resins are ethylhydroxyethyl cellulose, wood rosin, and mixtures of ethyl cellulose with acrylic resins, particularly the polymethacrylates of lower alcohols and monobutyl ether of ethylene glycol monoacetate.

The commonly used solvents are terpene alcohols, pine oil, mineral oil, and ether alcohols that boil in the range of 130°–350° C. Exemplary solvents, used independently or in combination are diethylene glycol monobutyl ether, diethylene glycol dibutyl ether, diethylene glycol monobutyl ether acetate, dibutyl phthalate, dioctyl phthalate, dimethyl phthalate, butyl diglyme, and the like.

Dispersant and rheology control agents may be added, and are used in small quantities at about 0.05–1.0% of the total ink weight. Commonly used additives are triethylamine, hydrogenated caster oil, oleic acid, stearic acid, and paraffin.

EXAMPLES

In the following examples, thick film inks were prepared in which an ester of tall oil fatty acids was substituted for part of the solvent in the vehicles. The capabilities of these inks to incorporate solids and retain solvent, to transfer from the screen, and to print well defined small features were measured and compared to control inks. The test methods are outlined here.

TEST METHODS

The initial viscosities of all samples were measured on a Brookfield Viscometer and are reported in units of Pa.s. A viscosity of 200 to 350 Pa.s is preferable for dielectric inks, and a viscosity of 140 to 350 Pa.s, for conductive and resistive inks.

For the dielectric inks, the highest solids tolerated in the vehicle to achieve printing was determined as follows. Initial sample dielectric inks were prepared by blending 80 parts by weight of a dielectric powder with 20 parts by weight organic vehicle to a total of 50 grams of ink. Each sample was blended with vigorous shaking on a paint can shaker, followed by dispersion on a three-roll mill. A 20 gram portion of each sample was placed on a screen with a 5 cm×5 cm pattern and screen printing was attempted. If the ink did not fully dispense through the screen, it was recovered and thinned by the dropwise addition of vehicle, in two drop increments (approximately 0.1 g per drop). Attempts to dispense the ink after each incremental addition of vehicle were made until the ink did dispense fully through the screen. The solids content present at that point was measured by burning off the vehicle in 0.5 g ink.

For all samples, a measure of the deposition of the ink onto a substrate, called the transfer weight, was used as an indication of the ability of the ink to release from the screen. The transfer weight was measured and reported in grams as the difference in weight of a 5 cm×5 cm substrate before printing and after printing. The printed substrate was prepared by applying a 20 gram sample of ink to the screen and dispensing the ink with one stroke of a squeegee over the screen.

For all samples, the evaporation rate was used as a measure of the percentage of solvent remaining in the ink after exposure to room temperature (25° C.) for 22 hours. The ink was printed onto a circuit board and left open to the atmosphere for 22 hours at 25° C. and then dried in an oven at 200° C. for two hours. Four measurements were taken during this period: the weight of the substrate, the weight of the printed circuit board immediately after printing, the weight after drying at room temperature for 22 hours, and the weight after oven drying to remove all the solvent. The percentage of solvent remaining was calculated according to the formula $[(X-Z)/(Y-Z)] \times 100\%$, where X is the difference in weight between the circuit after drying for 22 hours at room temperature and the substrate, Y is the difference in weight between the freshly printed circuit and substrate, and Z is the difference in weight between the printed circuit dried at 200° C. and the substrate.

For the dielectric samples, the definition of the printed via was used as a measure of the thixotropic properties of the ink. The ink was printed through a screen having 10 mil×10 mil vias 50 times and the size of the 50th printed via was measured after drying. The closer the dried dimensions were to 10 mil×10 mil was indicative of how quickly the viscosity of the ink recovered after the shear of printing.

For the conductive or resistive samples, the definition of the printed circuitry lines was used as a measure of the thixotropic properties of that ink. The ink was printed in lines having a 0.002" width separated by 0.003" spaces; lines of 0.004", spaces of 0.004"; and lines of 0.008", spaces of 0.008". The finest definition (i.e. without smudging or jagged edges) of line and space features that could be obtained for each ink was determinative of the better thixotropic properties.

EXAMPLE I

Thick Film Dielectric Inks

Sample dielectric thick film inks were prepared containing 80 parts by weight of a dielectric powder having a surface area of approximately 3.5 $m^2/g$ and a specific gravity of 3.5 $g/c^2$ and 20 parts by weight of organic vehicle having the composition by weight percent recited in Table I.

The organic solvent mixture of the vehicle consisted of a 1:1:1 mixture of (i) 2,2,4-trimethyl 1,1,3-pentanediol monoisobutyrate, sold under the tradename Texanol (a product of Eastman Chemical Co., Kinsport, Tenn.); (ii) a mix of tertiary terpene alcohols sold under the tradename Terpineol (a product of Hercules, Inc., Wilmington, Del.) and (iii) diethylene glycol monobutyl ether, sold under the tradename Butylcarbitol (a product of Eastman Chemical Co., Kinsport, Tenn.).

The surfactant designated Surfactant #1 was a mixture of complex derivatives of sorbitol and oleic acid, sold under the tradename Liporb'O' (a product of Lipo Chemical, Inc., Paterson, N.J.); Surfactant #2 was N-tallow alkyltrimethylene diamineoleates, sold under the tradename Duomeen TDO (a product of AKZO Chemical, Inc., Chicago, Ill.).

Amine #1 was triethylenetetraamine; the amine designated Amine #2 was triethanolamine (both products of Fisher Scientific, Fairlawn, N.J.).

The cellulosic resin in the vehicle was ethyl cellulose T-200 (a product of Aqualon, a Division of Hercules, Inc., Wilmington, Del.

The ester of tall oil fatty acids in the vehicle was the methyl ester (a product of Arizona Chemical, Panama City, Fla.).

The vehicle compositions were tested according to the test methods above and the results are given in Table I. The results show that the presence of the methyl ester of tall oil fatty acids in the vehicle permits a higher loading of solids into the vehicle, a heavier transfer of weight of dielectric during printing, better via definition, and less evaporation than the control vehicle without the ester.

TABLE I

|  | A | B | C | D | E |
|---|---|---|---|---|---|
| Vehicle Composition |  |  |  |  |  |
| Solvent Mix (%) | 91.00 | 89.10 | 82.40 | 55.00 | 9.10 |
| Cellulosic Resin | 5.00 | 5.00 | 5.00 | 5.00 | 5.00 |
| Surfactant #1 | 1.00 | 1.00 | .75 | 1.00 | 1.00 |
| Surfactant #2 | 1.00 | 1.00 | .75 | 1.00 | 1.00 |
| Amine #1 | 1.00 | 1.00 | .75 | 1.00 | 1.00 |
| Amine #2 | 1.00 | 1.00 | .75 | 1.00 | 1.00 |
| Methyl Ester of Tall Oil Fatty Acids | None | 0.90 | 9.60 | 36.00 | 81.90 |
| Dielectric Ink Properties |  |  |  |  |  |
| Initial Viscosity (Kcps) | 190 | 310 | 295 | 222.5 | 245 |
| Highest Solids Tolerated for Printing (%)[a] | 77.7 | 78.9 | 78.8 | 78.6 | 80.0 |
| Transfer Weight (gms)[b] | .1142 | .1349 | .1691 | .1614 | .1253 |
| Via Definition (mil) | 6.1 | 6.9 | 9.6 | 6.7 | 6.7 |
| Evaporation Test | 16.7 | 15.98 | 30.0 | c | 88.92 |

Notes:
[a]For dielectric powders with specific gravity of 3–4 g/c$^2$, a solids content in the range of 73–76% is typically required to accomplish electrical isolation in three layers of printing; when the solids content is as high as 78–79%, only two layers would be needed.
[b]A transfer weight of greater than 0.15 g in these tests indicates dielectric isolation can be achieved in two layers.
c. Not recorded.

EXAMPLE II

Thick Film Dielectric Inks

Inks containing 80 parts by weight dielectric (as in Example I) and 20 parts by weight vehicle were prepared as in Example I with the vehicle composition given in Table II. The solvent mix was the same as used in Example I and the acrylic resin was Acryloid B67 (a product of Rohm and Haas, Philadelphia, Pa.). The inks were tested according to the test methods above and the results, set out in Table II, show that the vehicle containing the ester of tall oil fatty acids holds a higher solids content, transfers more weight, prints more open vias, and exhibits less evaporation than the vehicles without the ester of tall oil fatty acids.

TABLE II

|  | A | B |
|---|---|---|
| Vehicle Compositions |  |  |
| Solvent Mixture | 80.00 | 55.00 |
| Acrylic Resin | 20.00 | 20.00 |
| Methyl Ester of Tall Oil Fatty Acids | None | 25.00 |
| Ink Properties |  |  |
| Initial Viscosity (Kcps) | 214 | 174 |
| Highest Solids Tolerated for Printing (%) | 75.5 | 79.7 |
| Transfer Weight (gms) | .1123 | .1494 |
| Via Definition | 2.7 mil | 5.5 mil |
| Evaporation Test 25° C. | 18.2 | 61.7 |

EXAMPLE III

Thick Film Conductive Inks

Inks were prepared by mixing and three-roll milling 82 parts by weight gold, 4.2 parts of a bismuthborosilicate glass, and 13.8 parts by weight vehicle with the vehicle composition in percent by weight set out in Table III.

The gold was a mixture of spheres and flakes having an average particle size of 2 microns; the bismuthborosilicate glass had an average particle size of one micron.

The solvent mix in the vehicle was a 1:4 mix of 1 part Terpineol (a mix of tertiary terpene alcohols, a product of Hercules, Inc., Wilmington, Del.) and 4 parts diethylene glycol monobutyl ether (sold under the tradename Butylcarbitol by Eastman Chemical Co.)

The cellulosic resin was ethyl cellulose N-4 (a product of Aqualon).

The amine was triethanolamine (a product of Fisher Scientific, Fairlawn, N.J.).

The ester was a mix of dipentaerythriol esters of tall oil fatty acids (a product of Hercules, Inc., Wilmington, Del.).

The inks were tested according to the test methods above and the results are set out in Table III. The results show that the vehicles containing the ester of tall oil fatty acids give the inks a higher transfer weight, better line, surface and edge definition, and less evaporation than the control without the ester.

TABLE III

|  | A | B |
|---|---|---|
| Vehicle Compositions |  |  |
| Solvent Mix | 84.01 | 75.69 |
| Cellulose | 15.84 | 15.84 |
| Amine #2 | 0.15 | 0.15 |
| Ester of Tall Oil Fatty Acids | None | 8.32 |
| Ink Properties |  |  |
| Initial Viscosity (Kcps) | 286 | 307 |
| Transfer Weight (gms) | .2890 | .2932 |
| Fine Line Definition | .008" × .008" | .004" × .004" |
| Surface, Edge Definition | rough, fuzzy | flat, sharp |
| Evaporation Test 25° C. | 33.33 | 34.67 |

EXAMPLE IV

Thick Film Conductive Inks

Inks were prepared by mixing and three-roll milling in parts by weight 30 parts palladium powder, 35 parts silver powder, 10 parts borosilicate glass, and 25 parts of vehicle having the same vehicle composition set out in Table IV.

The palladium powder, average particle size two microns, and silver powder, average particle size three microns, were obtained from Degussa Corporation, Precious Metal Division (Metz), South Plainfield, N.J.

The borosilicate glass had an average particle size of one micron.

In the vehicle, the solvent mix was the same as Example III; the cellulose resin was the same as Example III; the acrylic resin was the same as Example II; the amine was same as in Example III; and the ester was the same as in Example III.

The inks were tested according to the test methods above and the results are set out in Table IV. The results show that the vehicles containing the ester of tall oil fatty acids provided inks that gave a higher transfer weight, better line, surface and edge definition, and less evaporation than the control without the ester.

TABLE IV

|  | A | B |
|---|---|---|
| Vehicle Compositions |  |  |
| Solvent Mix | 80.32 | 72.20 |
| Cellulose Resin | 15.73 | 15.73 |
| Acrylic Resin | 3.16 | 3.16 |
| Amine | .79 | .79 |
| Ester of Tall Oil Fatty Acids | None | 8.12 |
| Ink Properties: |  |  |
| Initial Viscosity (Kcps) | 170 | 172 |
| Transfer Weight (gms) | .0123 | .0131 |
| Fine Line Definition | .008" × .008" | .004" × .004" |
| Evaporation Test 25° C. | 27.43 | 31.37 |

EXAMPLE V

Thick Film Restive Inks

Inks were prepared by mixing and three-roll milling in parts by weight 24 parts of ruthenium dioxide, 43 parts borosilicate glass, 1 part manganese dioxide, and 32 parts vehicle with the composition set out in Table V.

The ruthenium dioxide (800/2H) was obtained from Johnson Matthey, West Detford, N.J. The borosilicate glass (#3476) was obtained form Ferro Corporation, Cleveland, Ohio. The manganese dioxide (M-108) was obtained from Fisher Scientific, Fair Lawn, N.J.

In the vehicle, the solvent mix was 8 parts diethylene glycol monobutyl ether and 1 part safflower oil; the cellulose resin was the same as in Example IV; the acrylic resin was the same as in Example IV; and the ester was the same as in Example IV.

The inks were tested according to the test methods above and the results are set out in Table V. The results show that the vehicles containing the ester of tall oil fatty acids gave the inks a higher transfer weight, better line, surface and edge definition, and reduced solvent evaporation compared to the control without the ester.

TABLE V

|  | A | B |
|---|---|---|
| Vehicle Compositions: |  |  |
| Solvent Mix | 83.94 | 61.40 |
| Cellulose Resin | 13.38 | 13.38 |
| Acrylic Resin | 2.68 | 2.68 |
| Ester of Tall Oil Fatty Acids | None | 22.54 |
| Ink Properties: |  |  |
| Initial Viscosity (Kcps) | 230 | 185 |
| Transfer Weight (gms) | .0101 | .0149 |
| Surface, Edge Definition | wavy edges matte surface | sharp edges smooth surface |
| Evaporation Test | 18.65 | 41.01 |

We claim:

1. In 100 parts by weight of a thick film ink consisting of 40–95 parts of conductive, resistive, or insulating powder dispersed in 60–5 parts of an organic vehicle of resins, solvent, and additives, an improved vehicle system comprising by weight 1–40% resins and 99–60% solvent in which 1–90% by weight of the solvent is an ester of tall oil fatty acid having a viscosity below 200 mPa.s.

2. The vehicle system of claim 1 in which the ester is an ester of tall oil fatty acid selected from the group consisting of the $C_1$–$C_6$ alkyl esters.

3. The vehicle system of claim 1 in a dielectric ink.

4. The vehicle system of claim 1 in a conductive ink.

5. In 100 parts by weight of a thick film dielectric ink consisting of 40–95 parts of insulating powder dispersed in 60–5 parts of an organic vehicle of resins, solvent, and additives, an improved vehicle system comprising by weight 1–40% resins and 99–60% solvent in which 1–90% by weight of the solvent is an ester of tall oil fatty acid selected from the group consisting of the $C_1$–$C_6$ alkyl esters.

* * * * *